(12) United States Patent
Hooper et al.

(10) Patent No.: US 7,977,213 B1
(45) Date of Patent: Jul. 12, 2011

(54) USE OF LASER ENERGY TRANSPARENT STOP LAYER TO ACHIEVE MINIMAL DEBRIS GENERATION IN LASER SCRIBING A MULTILAYER PATTERNED WORKPIECE

(75) Inventors: Andy E. Hooper, Portland, OR (US); David Barsic, Portland, OR (US); Clint R. Vandergiessen, Beaverton, OR (US); Haibin Zhang, Portland, OR (US); James N. O'Brien, Bend, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 12/751,736

(22) Filed: Mar. 31, 2010

(51) Int. Cl.
*H01L 21/00* (2006.01)
(52) U.S. Cl. ................ 438/463; 257/E21.238
(58) Field of Classification Search .............. 438/114, 438/462, 463, 459; 257/E21.238
See application file for complete search history.

(56) References Cited

U.S. PATENT DOCUMENTS

| | | | | |
|---|---|---|---|---|
| 6,303,977 B1* | 10/2001 | Schroen et al. | ............ | 257/635 |
| 2001/0054606 A1* | 12/2001 | Weishauss et al. | ...... | 219/121.83 |
| 2006/0249816 A1* | 11/2006 | Li et al. | ............ | 257/618 |
| 2007/0272666 A1* | 11/2007 | O'Brien et al. | ........ | 219/121.69 |
| 2008/0213978 A1* | 9/2008 | Henry et al. | ............ | 438/462 |
| 2009/0245302 A1* | 10/2009 | Baird et al. | ............ | 372/25 |
| 2010/0059864 A1* | 3/2010 | Mahler et al. | ........... | 257/620 |
| 2010/0099239 A1* | 4/2010 | Dunne et al. | ............ | 438/463 |
| 2010/0207250 A1* | 8/2010 | Su et al. | ............ | 257/620 |

* cited by examiner

*Primary Examiner* — W. David Coleman
(74) *Attorney, Agent, or Firm* — Stoel Rives LLP

(57) ABSTRACT

A solution to failure mechanisms caused by mechanical sawing of a mechanical semiconductor workpiece entails use of a laser beam to cut and remove the electrically conductive and low-k dielectric material layers from a dicing street before saw dicing to separate semiconductor devices. A laser beam forms a laser scribe region such as a channel in the electrically conductive and low-k dielectric material layers, the bottom of the channel ending on a laser energy transparent stop layer of silicon oxide lying below all of the electrically conductive and low-k dielectric material layers. The disclosed process entails selection of laser parameters such as wavelength, pulse width, and fluence that cooperate to leave the silicon oxide layer stop layer completely or nearly undamaged. A mechanical saw cuts the silicon oxide layer and all other material layers below it, as well as the substrate, to separate the semiconductor devices.

8 Claims, 5 Drawing Sheets

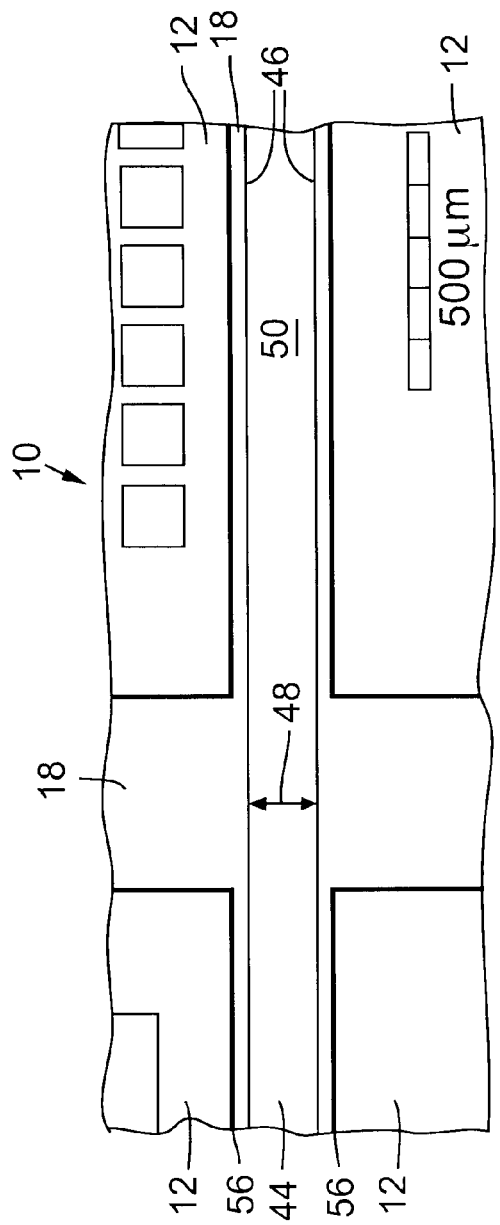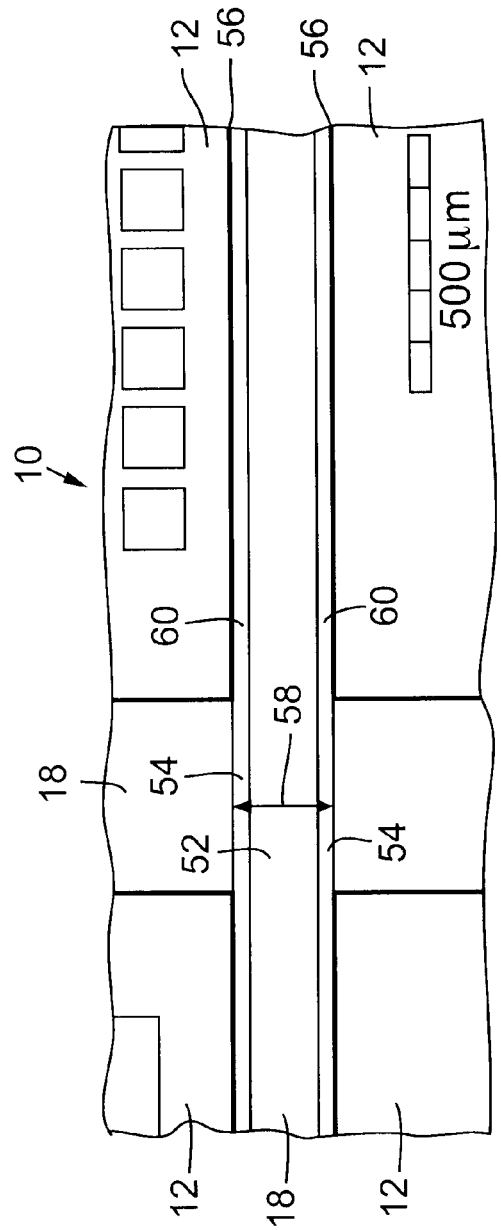

US 7,977,213 B1

USE OF LASER ENERGY TRANSPARENT STOP LAYER TO ACHIEVE MINIMAL DEBRIS GENERATION IN LASER SCRIBING A MULTILAYER PATTERNED WORKPIECE

COPYRIGHT NOTICE

© 2010 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

This disclosure relates to laser scribing of patterned semiconductor workpieces and, in particular, to use of a laser energy transparent stop layer to effect, with minimal laser scribing debris generation, scribing of a channel in a multilayer patterned workpiece.

BACKGROUND INFORMATION

Semiconductor devices are multilayer structures that are produced on a substrate, such as a silicon wafer, and then diced into individual chips by a mechanical saw or laser beam before packaging. The trend in semiconductor devices is to replace silicon dioxide dielectric layers with low-k dielectric material layers. Low-k dielectric materials are not mechanically strong; therefore, mechanical sawing of low-k dielectric material layers can cause a unique set of device failure mechanisms. A problem with laser scribing semiconductor devices is that the laser beam interacting with the multilayer structures generates a large amount of debris that must be removed or managed. Laser-generated debris is hot and contains molten material. When it lands on the wafer surface, the molten material or slag becomes fused onto the surface. Laser generated debris resulting from scribing is managed by either cleaning the wafer after scribing, or applying a water-based coating to the wafer surface before scribing, to prevent the hot slag from sticking to the wafer surface, and then cleaning the coating along with the resulting debris after scribing. Coating and cleaning add cost and complexity to the scribing process. What is needed is a method of scribing semiconductor devices quickly and completely, with a minimum of debris generation.

SUMMARY OF THE DISCLOSURE

One solution to failure mechanisms caused by mechanical sawing entails use of a laser beam to cut and remove the electrically conductive and low-k dielectric material layers from a dicing street before saw dicing. The disclosed process uses a laser beam to form a laser scribe region such as a channel or groove (hereafter "channel") in a semiconductor workpiece that includes electrically conductive (e.g., copper) and low-k dielectric material layers, the bottom of the channel ending on a laser energy transparent stop layer of silicon oxide (SiO$_x$), preferably silicon dioxide, lying below all of the electrically conductive and low-k dielectric material layers. The silicon oxide layer can be prepared by a number of common processes, such as physical and chemical deposition, spin on glass (e.g., tetraethyl orthosilicate (TEOS)), or oxidation of silicon (such as thermal oxide). The semiconductor workpiece can also contain electrical circuitry. The disclosed process entails selection of laser parameters such as wavelength, pulse width, and fluence that cooperate to leave the silicon oxide layer stop layer completely or nearly undamaged. The result is a channel floor that conforms to the silicon oxide stop layer.

There are two preferred embodiments of scribing a semiconductor workpiece and thereafter dicing it to separate the semiconductor devices. One embodiment entails laser cutting a channel with side boundaries that define a channel width that is wider than the saw blade width to remove the device layers down and to the channel floor and thereafter using a mechanical saw to dice the semiconductor devices in the resulting channel. Another embodiment entails cutting on both side margins of the dicing street two scribe lines depthwise to the silicon oxide stop layer and then dicing the semiconductor devices with a mechanical saw between the scribe lines.

Additional aspects and advantages will be apparent from the following detailed description of preferred embodiments, which proceeds with reference to the accompanying drawings.

BRIEF DESCRIPTION OF THE DRAWINGS

FIGS. 3A and 3B are modified replicas of FIG. 1 that show two preferred laser scribing regions configured to separate the semiconductor devices of FIG. 1.

DETAILED DESCRIPTION OF PREFERRED EMBODIMENTS

Figure 1:
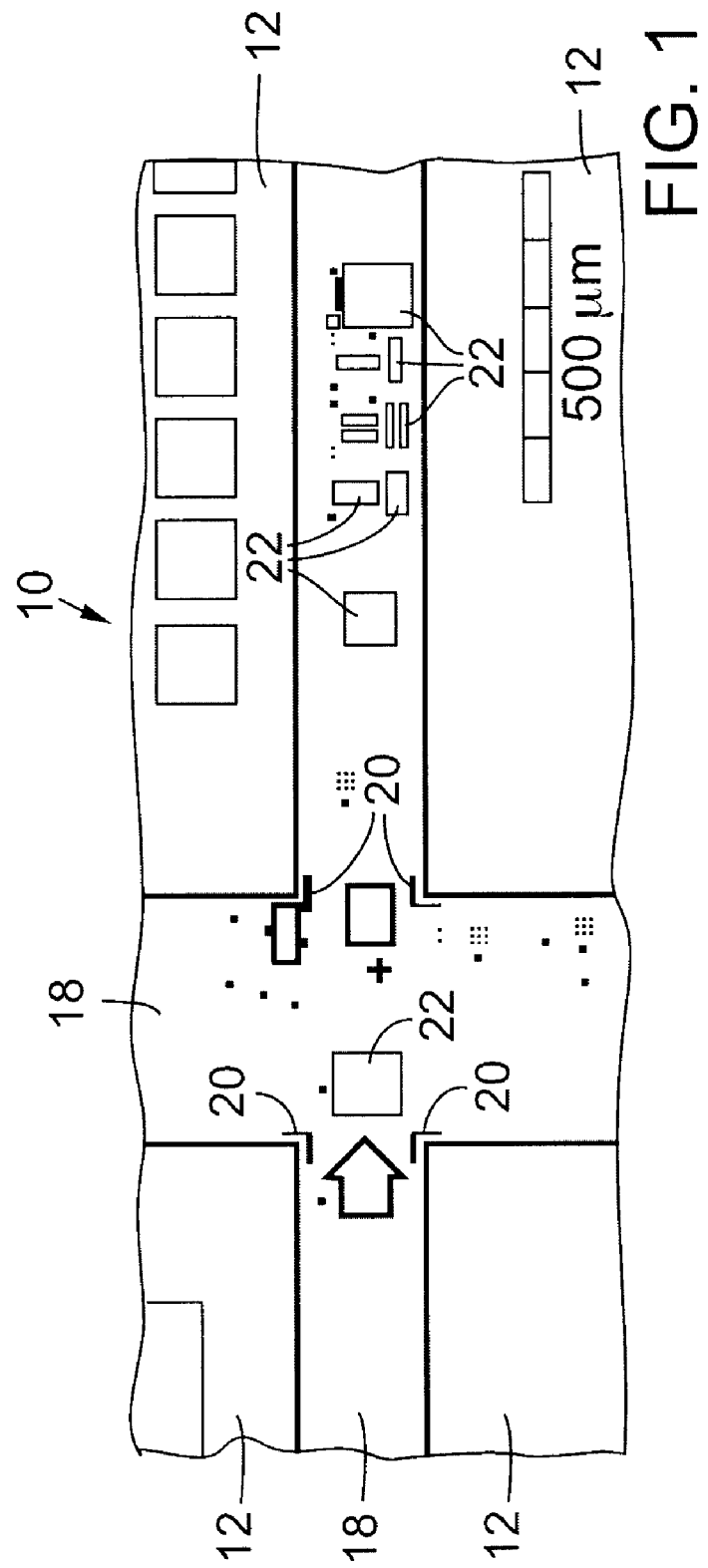
FIG. 1 is a fragmentary plan view of a patterned semiconductor workpiece that includes multiple, mutually spaced apart semiconductor devices that are separated by dicing streets.

FIG. 1 is a fragmentary plan view of a patterned semiconductor workpiece 10 embodied as a silicon wafer that includes multiple, mutually spaced apart semiconductor devices 12 (portions of four devices 12 shown) that include multilayer structures 14 (FIG. 2) fabricated on a silicon substrate 16 (FIG. 2) and that are separated by dicing streets 18. Alternative substrates 16 include glass, strained silicon, silicon on insulator, germanium, gallium arsenide, and indium phosphide. FIG. 1 also shows a variety of alignment targets 20 and other sacrificial test structures 22 occupying the areas within dicing streets 18.

Figure 2:
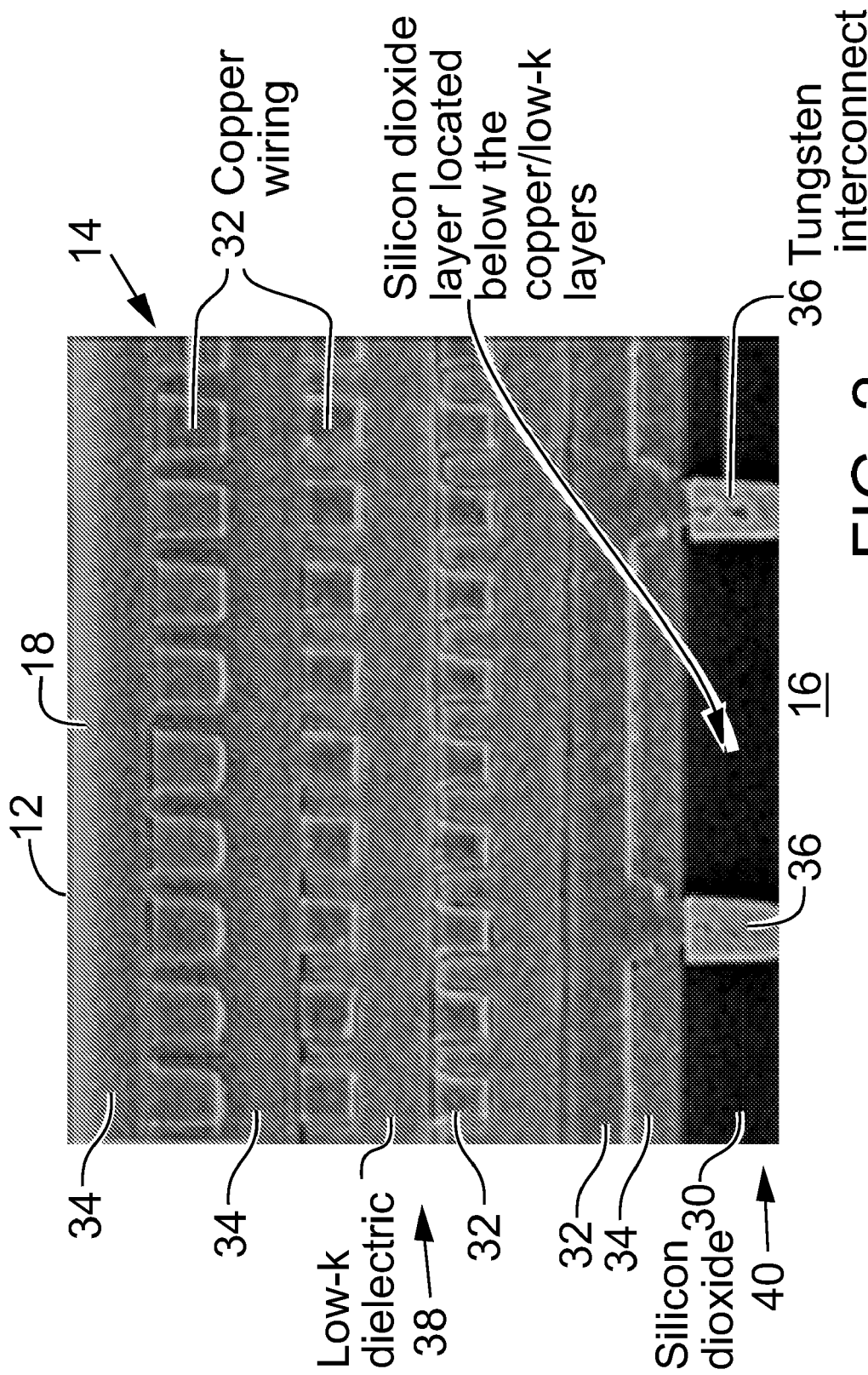
FIG. 2 is a magnified image showing a cross-sectional view of a semiconductor device of FIG. 1 that includes a multilayer structure composed of a silicon dioxide lower layer covered by layers of electrically conductive and low-k dielectric materials.

FIG. 2 is a cross-sectional view of a semiconductor device 12 that includes multilayer structure or stack 14 composed of a silicon dioxide lower layer 30 covered by layers of copper wires 32 surrounded by layers 34 of low-k dielectric material. Silicon dioxide layer 30 surrounds tungsten interconnect wires 36. Copper wires 32 and tungsten interconnect wires 36 extend into dicing street 18. Layers of copper wires 32 and layers 34 of low-k dielectric material are characterized by weak thermo-mechanical strength properties and, therefore, constitute mechanically weak layers 38 of multilayer stack 14 as compared to silicon dioxide layer 30, which is mechanically strong in that it is about ten times better than low-k material layers in almost every category of thermo-mechanical properties. These thermo-mechanical properties include interlayer adhesion; adhesion to copper; thermal stability; tensile strength; modulus, hardness; cohesive strength; and etch selectivity. Multilayer stack 14 is fabricated such that mechanically weak layers 38 are located depthwise farther from silicon substrate 16 and thermo-mechanically strong layers 40, including silicon dioxide layer 30 and any layer formed below it, are located depthwise closer to silicon substrate 16.

Laser scribing of semiconductor workpiece 10 with minimal debris generation entails emitting a pulsed laser beam of temporally spaced apart laser pulses and aligning them with one of dicing streets 18 for incidence on mechanically weak upper layers 38 of semiconductor workpiece 10. The laser pulses are characterized by a wavelength, pulse width, and fluence such that mechanically weak upper layers 38 of multilayer stack 14 absorb and the mechanically strong lower layers 40 transmit the energy of the laser beam propagating through semiconductor workpiece 10. Silicon dioxide layer 30 functions as a layer energy transparent stop layer for mechanically weak upper layers 38.

The reason why silicon dioxide layer 30 functions as a laser energy stop layer is that it is in thermal contact with silicon substrate 16. Silicon substrate 16 acts as a heat sink for silicon dioxide stop layer 30, which consequently remains intact during laser scribing. In contrast, one or more silicon dioxide passivation layers included in the stack of weak upper layers 38 are different from silicon dioxide layer 30 because the former silicon dioxide layers are surrounded by other dielectric materials that are poor heat conductors. This allows heat buildup in silicon dioxide layers forming portions of weak upper layers 38 so that they can be removed by laser energy.

A laser beam positioning system (not shown) imparting relative motion between semiconductor workpiece 10 and the pulsed laser beam aligned with dicing street 18 effects depthwise removal of mechanically weak upper layers 38 with minimal debris generation and thereby forms a laser scribe region with side boundaries extending lengthwise along dicing street 18. The side boundaries of the laser scribe region formed are defined by exposed portions of laser energy transparent stop layer 30 in accordance with either one of two preferred embodiments, which are described with reference to FIGS. 3A and 3B showing replicas of FIG. 1 with the alignment targets and sacrificial test structures removed for clarity.

FIG. 3A shows a laser scribe region in the form of a channel 44 cut by one or more passes of a pulsed laser beam directed along dicing street 18 in accordance with a first preferred embodiment. Channel 44 has side boundaries 46 separated by a distance 48 that defines a channel width. The laser beam removes between side boundaries 46 mechanically weak upper layers 38 of material to form channel 44, with silicon dioxide layer 30 as a floor 50 that remains substantially undamaged by the laser beam. Separation of semiconductor devices 12 is performed by using a positioning stage or other device to impart relative motion between a mechanical saw and semiconductor workpiece 10 lengthwise along dicing street 18. The mechanical saw has a saw blade of a thickness that is less than the channel width so that the mechanical saw cuts through no mechanically weak material of upper layers 30 to separate semiconductor devices 12 located on either side of channel 44.

FIG. 3B shows a laser scribe region 52 in which each of its side boundaries is formed by a scribe line 54 that is cut by one or more passes of a pulsed laser beam directed along a side margin 56 of dicing street 18, in accordance with a second preferred embodiment. Scribe lines 54 establish a distance 58 that defines a laser scribe region cutting width. The laser beam removes mechanically weak upper layers 38 of material to form each scribe line 54, with silicon dioxide layer 30 as a floor 60 that remains substantially undamaged by the laser beam. Mechanically weak upper layers 38 of material are present in the space between scribe lines 54.

Separation of semiconductor devices is performed by using a positioning stage or other device to impart relative motion between a mechanical saw and semiconductor workpiece 10 lengthwise along dicing street 18. The mechanical saw has a saw blade of a thickness that is within the laser scribe region cutting width 58 but does not extend beyond either side margin 56 of dicing street 18 so that the mechanical saw cuts through no mechanically weak material of upper layers 38 of semiconductor devices 12 as they are being separated. The mechanical saw cutting region exceeds the saw blade thickness to allow for x-y saw blade position variation and blade deflection. The saw blade can cut into scribe lines 54 but not cut outside of side margins 56. There is no physical attachment between weak upper layers 38 of material on either side of scribe lines 54, so the mechanical saw can cut anywhere inside laser scribe region 58 without causing damage to weak upper layers 38 outside of side margins 56.

Skilled persons will appreciate that cutting with a mechanical saw generates substantial amount of debris in the form of cold particles that do not fuse to the wafer surface. Such debris can readily be washed away during a post-sawing cleanup operation. Moreover, mechanical sawing is performed under a stream of water (sometimes mixed with a liquid lubricant) that prevents the possibility of hot slag formation.

Figure 4A:
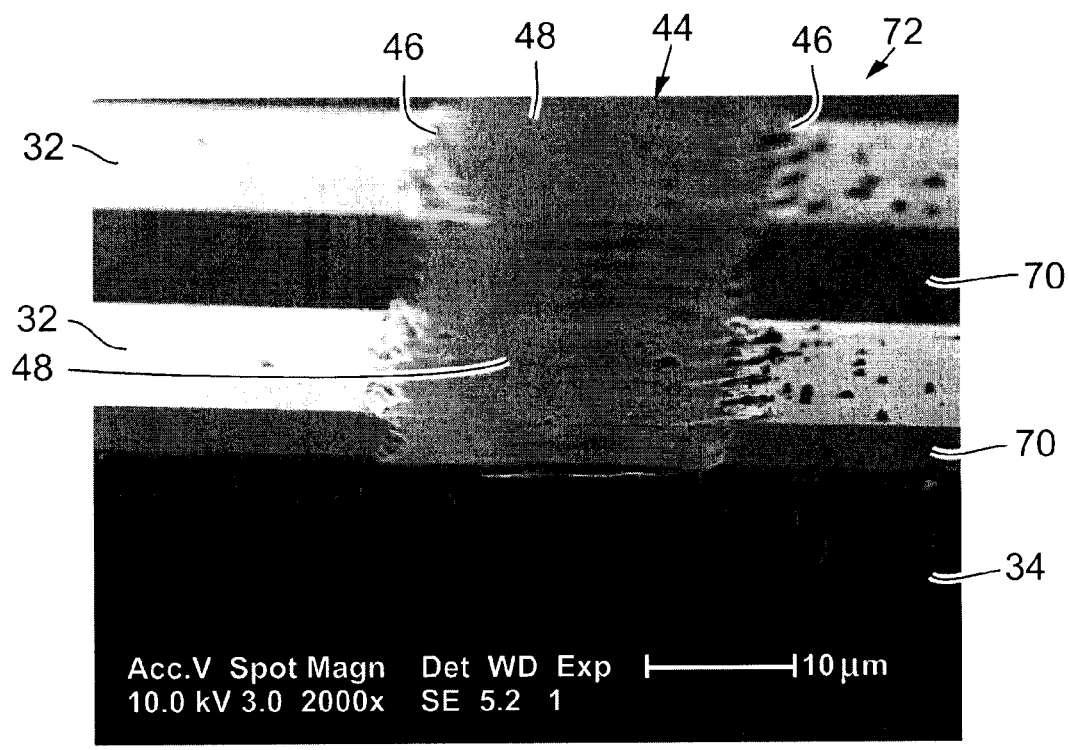
FIG. 4A is an electron micrograph tilted image of a debris field after performing laser scribing of a silicon wafer.
Figure 4B:
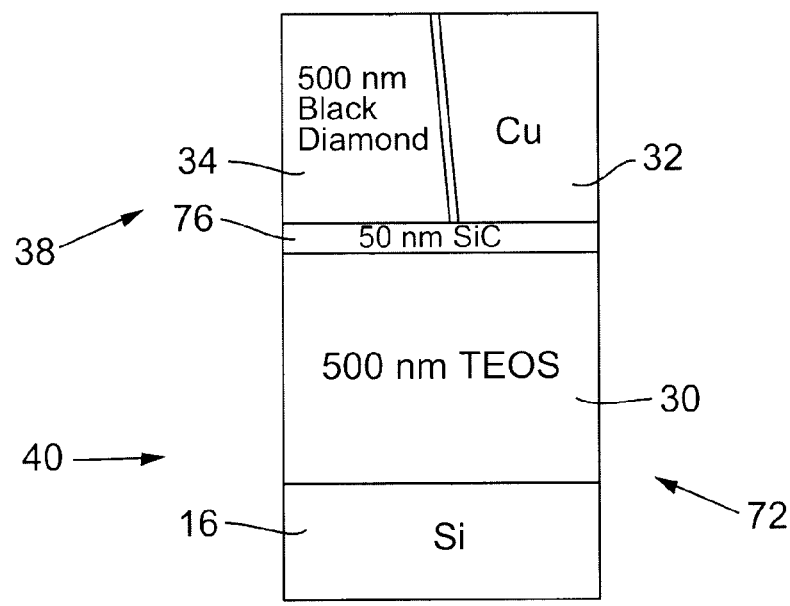
FIG. 4B is a simplified block diagram showing generally the multilayer structure of the silicon wafer scribed to produce the debris field shown in FIG. 4A.

FIG. 4A is an electron micrograph tilted image of a debris field 70 after performing laser scribing of a silicon wafer 72 (FIG. 4B) in accordance with the first preferred embodiment relating to FIG. 3A. FIG. 4B is a simplified block diagram showing generally the multilayer structure of silicon wafer 72. Silicon wafer 72 includes a 0.5 µm-thick layer of copper wire 32 surrounded by Black Diamond 1 low-k dielectric layer 34. Copper wire 32 and dielectric layer 34 are formed on a 50 nm-thick silicon carbide layer 76, which is formed on a 0.5 µm-thick TEOS silicon dioxide layer 30. Two passes of a 30 µm spot diameter, round-top-hat-shaped 355 µm laser beam at 20 KHz repetition rate, 200 mW power, about 20 ns pulse width, and 20 mm/sec scan velocity removed only mechanically weak layers 38 of copper wires 32 and low-k dielectric layers 34 and 76. Mechanically strong lower layer 40 including silicon dioxide layer 30 was left uncut for a mechanical saw to complete a singulation process. FIG. 4A shows that the above-described process significantly eliminates debris and slag generated by the laser scribing process. FIG. 4A also shows that floor 50 of channel 44 is very flat. The flatness of channel floor 50 is related to the flatness of silicon dioxide layer 30 as it was deposited during fabrication of semiconductor device 12. Because the disclosed process removes weak upper layers 38 of material down to bottom silicon dioxide layer 30, channel floor 50 is as flat as silicon dioxide layer 30 was at the start of the laser scribing process.

Figure 5:
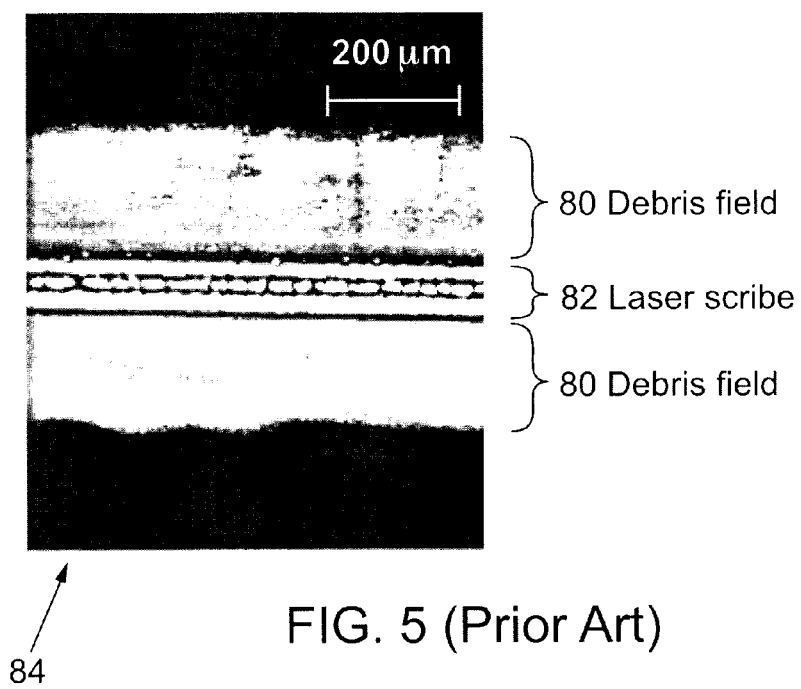
FIG. 5 is an electron micrograph of a debris field created by laser scribing a scribe line in a silicon substrate in accordance with a prior art technique.

FIG. 5 is an electron micrograph of a debris field 80 created by laser scribing a scribe line 82 in a silicon substrate 84 in accordance with the prior art technique. The debris generated by laser scribing substrate 84 extends several hundred microns on either side of scribe line 82.

In general, the laser wavelength, pulse width, and fluence can be selected so that, after laser scribing in accordance with the disclosed technique, the silicon oxide stop layer is completely or nearly undamaged. The result is a channel floor that conforms to the silicon oxide stop layer. This is possible because, by proper selection of laser parameters, the silicon oxide material is transparent to the laser, but the metal and low-k structures are not.

The exact laser parameters required to scribe to the silicon oxide stop layer are device dependent. The laser parameters required depend on the composition, orientation, and thickness of the different layers of the multilayer structure of the semiconductor devices. For any given semiconductor workpiece 10, there is a range of laser parameters that define a process window for scribing down to the silicon oxide stop layer. Typically, the parameters of wavelength, spot size, spot shape, and repetition rate are fixed, while laser power, scribe velocity, and number of scribe passes are varied until the scribe-to-oxide process window is revealed. If the resulting process window is too small, the spot size, spot shape, repetition rate, or laser wavelength can be adjusted as necessary to improve the process. Table 1 below summarizes the parameter ranges.

TABLE 1

| | |
|---|---|
| Wavelength (±10 nm): | 532 nm, 355 nm, and 266 nm |
| Spot size ($1/e^2$): | 3 to 100 μm. |
| Spot shapes (spatial): | Gaussian, tophat round, square |
| Rep rates: | 10 KHz to 2 MHz |
| Scribe velocity: | 50 to 5000 mm/s |
| Number of scribe passes to reach lower oxide stop layer: | 1 to 25 |
| Laser power range: | 0.1 to 20 W |

The thicknesses of the individual semiconductor material layers to be cut, removed, or processed are between 0.5 nm and 10,000 nm. The number of layers is between 1 and 50 (excluding silicon dioxide stop layer 30). The semiconductor material layers to be cut, removed, or processed by laser beam contain one or more of the following materials:

a) Dielectric materials $SiO_2$ (silicon dioxide), $Si_3N_4$ (silicon nitride), silicon carbide, silicon oxynitride, tantalum nitride, or tantalum oxide;

b) Dielectric materials made from any combination of two or more of silicon, oxygen, nitrogen, carbon, hydrogen, and fluorine. These dielectric materials would include low-k materials. Depending on which ones of the elements are selected, the individual chemical bonds of the dielectric material would be C—C, C═C, C C, C—F, C—H, O—H, C—O, C═O, C—N, C═N, C≡N, in addition to "dangling bonds";

c) Dielectric materials listed above in items a) and b) that have a porous structure so as to lower the dielectric constant of the material (for example, Xerogels or Aerogels);

d) Metal layers of copper (Cu), aluminum (Al), tungsten (W), chromium (Cr), titanium (Ti), nickel (Ni), cobalt (Co), tantalum (Ta), gold (Au), and platinum (Pt) (including the surface oxides on these materials); and e) Polysilicon and silicon.

The following is a list of all low-k materials that would be cut by the laser:

a) Any of the commercially available low-K dielectric materials made or licensed by the following three companies:
   (i) Applied Materials Black Diamond 1™ Black Diamond 2™, and BLOk™.
   (ii) Novellus Coral™
   (iii) ASM International Aurora™ b) Low-k dielectric materials in the categories of "carbon-doped silicon oxide" or "fluorine-doped silicon oxide." These materials have chemical stoichiometries comprised of any combination of two or more of the following elements: silicon, oxygen, nitrogen, carbon, hydrogen, and fluorine. The bonding between the elements can be by single, double, or triple bonds depending on the element, i.e., C—C, C═C, C C, C—F, C—H, O—H, C—O, C═O, C—N, C═N, C≡N, in addition to "dangling bonds";

c) Spin-on polymeric low-k dielectrics, such as SiLK™ from Dow Chemical, polyimides, polynorbornenes, benzocyclobutene, PTFE (Teflon™), and Teflon™-like materials such as PFA, silicone based polymeric dielectric materials, hydrogen silsesquioxane (HSQ), and methylsilsesquioxane (MSQ); and d) Dielectric materials listed in items above that have a porous structure to lower the materials dielectric constant.

It will be obvious to those having skill in the art that many changes may be made to the details of the above-described embodiments without departing from the underlying principles of the invention. The scope of the present invention should, therefore, be determined only by the following claims.

The invention claimed is:

1. A method of scribing semiconductor devices with minimal debris generation, comprising:

providing a patterned semiconductor workpiece containing multiple, mutually spaced apart semiconductor devices that include multilayer structures fabricated on a semiconductor substrate and that are separated by dicing streets, the multilayer structures including mechanically weak upper and mechanically strong lower layers of material located depthwise, respectively, farther from and nearer to the semiconductor substrate, the mechanically weak upper layers including electrically conductive and low-k dielectric materials characterized by weak thermo-mechanical strength properties and the mechanically strong lower layers including dielectric material characterized by strong thermo-mechanical strength properties, and the mechanically strong lower layers including a layer of silicon oxide material functioning as a laser energy transparent stop layer for the mechanically weak upper layers;

generating a pulsed laser beam of multiple temporally spaced apart laser pulses characterized by a wavelength, pulse width, and fluence such that the mechanically weak upper layers absorb the laser beam and the mechanically strong lower layers transmit the laser beam;

aligning the pulsed laser beam with one of the dicing streets; and imparting relative motion between the pulsed laser beam and the semiconductor workpiece lengthwise along the dicing street to effect, with minimal debris generation, depthwise removal of the mechanically weak upper layers and thereby form a laser scribe region having side boundaries that are defined by exposed portions of the laser energy transparent stop layer and remain substantially undamaged by the pulsed laser beam.

2. The method of claim 1, further comprising separating the semiconductor devices by imparting relative motion between a mechanical saw and the semiconductor workpiece lengthwise along the dicing street and between the side boundaries of the laser scribe region to cut through the mechanically strong lower layers to separate the semiconductor devices located on either side of the laser scribe region.

3. The method of claim 1, in which the low-k dielectric material includes one or more of oxide derivatives, organics, and highly porous oxides.

4. The method of claim 1, in which the electrically conductive material includes copper, aluminum, tungsten, chromium, titanium, nickel, cobalt, tantalum, gold, or platinum.

5. The method of claim 1, in which the semiconductor substrate is made of silicon.

6. The method of claim 2, in which the mechanical saw includes a saw blade having a saw blade width, the side boundaries of the laser scribe region are separated by a distance that defines a laser scribe region width greater than the saw blade width, and no portion of the mechanically weak upper layers of material is present within the laser scribe region through which the mechanical saw cuts.

7. The method of claim 2, in which the mechanical saw includes a saw blade having a saw blade width, each of the side boundaries of the laser scribe region is formed by a scribe line, the scribe lines establish a distance that defines a laser scribe region cutting width greater than the saw blade width, and a portion of the mechanically weak upper layers of material is present between the scribe lines forming the laser scribe region through which the mechanical saw cuts.

8. The method of claim 7, in which the dicing street is defined by side margins, and in which the scribe lines are formed on the side margins of the dicing street.

\* \* \* \* \*